(12) United States Patent  
Salim et al.

(10) Patent No.: US 11,880,171 B2
(45) Date of Patent: *Jan. 23, 2024

(54) FLUORESCENCE DETECTION WITH OPTICAL-TRAP-ENHANCED SPECTRAL FILTERING

(71) Applicant: ColdQuanta, Inc., Boulder, CO (US)

(72) Inventors: Evan Salim, Lafayette, CO (US); Judith Olson, Northglenn, CO (US); Andrew Kortyna, Boulder, CO (US); Dina Genkina, Hyattsville, MD (US); Flavio Cruz, Superior, CO (US)

(73) Assignee: ColdQuanta, Inc., Boulder, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/695,979

(22) Filed: Mar. 16, 2022

(65) Prior Publication Data

US 2022/0390370 A1 Dec. 8, 2022

Related U.S. Application Data

(60) Provisional application No. 63/197,375, filed on Jun. 5, 2021.

(51) Int. Cl.
*G01N 21/64* (2006.01)
*G04F 5/14* (2006.01)
*H03L 7/26* (2006.01)

(52) U.S. Cl.
CPC .......... *G04F 5/145* (2013.01); *G01N 21/645* (2013.01); *G04F 5/14* (2013.01); *H03L 7/26* (2013.01); *G01N 2021/6471* (2013.01)

(58) Field of Classification Search
CPC ......... G04F 5/145; G04F 5/14; G01N 21/645; G01N 2021/6471
See application file for complete search history.

(56) References Cited

U.S. PATENT DOCUMENTS 4,912,716 A 3/1990 Mead
5,548,124 A 8/1996 Takeshima
(Continued)

OTHER PUBLICATIONS

Author Unknown, Fm Spectroscopy with Tunable Diode Lasers, Mar. 1, 2022, pp. 1-8.
(Continued)

*Primary Examiner* — David P Porta
*Assistant Examiner* — Djura Malevic
(74) *Attorney, Agent, or Firm* — Van Pelt, Yi & James LLP; Clifton Leon Anderson

(57) ABSTRACT

A fluorescence detection process begins by localizing rubidium 87 atoms within an optical (all-optical or magneto-optical) trap so that at least most of the atoms in the trap are within a cone defined by an effective angle, e.g., 8°, of a spectral filter. Within the effective angle of incidence, the filter effectively rejects (reflects or absorbs) 778 nanometer (nm) fluorescence and effectively transmits 775.8 nm fluorescence. Any 775.8 nm fluorescence arrive outside the effective angle of incidence. Thus, using an optical trap to localize the atoms within the cone enhances the signal-to-noise ratio of the fluorescence transmitted through the spectral filter and arriving a photomultiplier or other photodetector, resulting fluorescence detection signal with an enhanced S/N.

18 Claims, 4 Drawing Sheets

(56) References Cited

U.S. PATENT DOCUMENTS

| | | | |
|---|---|---|---|
| 8,780,948 B2 | 7/2014 | Wilkinson | |
| 9,377,351 B2 * | 6/2016 | Colvin, Jr. | G01J 1/1626 |
| 10,340,658 B1 | 7/2019 | Boyd | |
| 2004/0160155 A1 * | 8/2004 | Partlo | H01S 3/225 |
| | | | 313/231.31 |
| 2004/0173760 A1 * | 9/2004 | Kino | G02B 21/0024 |
| | | | 250/458.1 |
| 2005/0214167 A1 * | 9/2005 | Archibald | G01N 21/3577 |
| | | | 422/68.1 |
| 2010/0149073 A1 * | 6/2010 | Chaum | G02B 27/017 |
| | | | 345/8 |
| 2011/0019186 A1 * | 1/2011 | Himmelhaus | G01N 21/7703 |
| | | | 356/317 |
| 2013/0324819 A1 * | 12/2013 | Colvin, Jr. | G01J 3/0218 |
| | | | 359/613 |
| 2022/0198586 A1 * | 6/2022 | Mimassi | G06N 20/20 |
| 2022/0393691 A1 * | 12/2022 | Salim | G04F 5/145 |

OTHER PUBLICATIONS

Martin et al., Compact Optical Atomic Clock Based on a Two-Photon Transition in Rubidium, Mar. 28, 2019, pp. 1-10.

* cited by examiner

FLUORESCENCE DETECTION WITH OPTICAL-TRAP-ENHANCED SPECTRAL FILTERING

BACKGROUND

Quantum technologies often detect fluorescence to identify quantum states of atoms and other molecular entities. For example, a cold-atom quantum computer can use fluorescence to distinguish atoms representing a logic-1 from a logic-0. Quantum sensors can use fluorescence intensity or fluorescent photon counts to measure some phenomena (e.g., microwave radiation) that causes atoms to change energy levels. Fluorescence occurs when an excited molecule, atom, or nanostructure, relaxes to a lower energy state (usually a ground state) through emission of a photon. Typically, the excited state is reached through absorption of one or more photons.

For many fluorescence applications, a strong signal-to-noise ratio (S/N) is desired for a reliable measurement. On the signal side, it can be difficult to capture (e.g., with a photo-multiplier or other photodetector) all or a large percentage of the emitted fluorescence photons as they are emitted in all directions; in some scenarios, reflectors can be used to increase the amount captured. On the noise side, scatter from the light used to excite the atoms can lower the S/N, so filtering to separate the excitation illumination from the fluorescence is often desirable.

Temporal filtering involves gating (i.e., turning off) the excitation illumination prior to turning on fluorescence detection; however, gating can be difficult to implement as the exact time of absorption is randomly distributed as is the delay from excitation to fluorescence emission (which is typically between 0.5 and 20 nanoseconds). Spatial filtering has limited effectiveness since scatter and fluorescence both can propagate over a wide range of directions. Commercially available spectral filters can work well when the illumination wavelength is very different from the fluorescence wavelength; however spectrally filtering illumination wavelengths within a few nanometers of the wavelength of the fluorescence to be detected is problematic. What is needed is an improved approach to separating illumination scatter from fluorescence when the wavelengths involved are only several nanometers apart.

DETAILED DESCRIPTION

The present invention provides for enhanced detection of fluorescence from a molecular entity (e.g., atom) vapor where background noise includes wavelengths close to that of the fluorescence. More specifically, an optical (e.g., all-optical or magneto-optical) trap is used to localize molecular entities within a narrow angle required by some spectral filters to effectively distinguish wavelengths near to a wavelength to be detected. In embodiments in which there are no other detectable fluorescence wavelengths, this localization enables fluorescence detection where otherwise there would be none. In embodiments in which there are more readily detectable fluorescence wavelengths, this localization provides for higher signal-to-noise (S/N) detection signals and/or other advantages. In the context of an atomic clock, the higher S/N provides for more effective oscillator regulation and thus a more stable atomic clock output.

Figure 1:
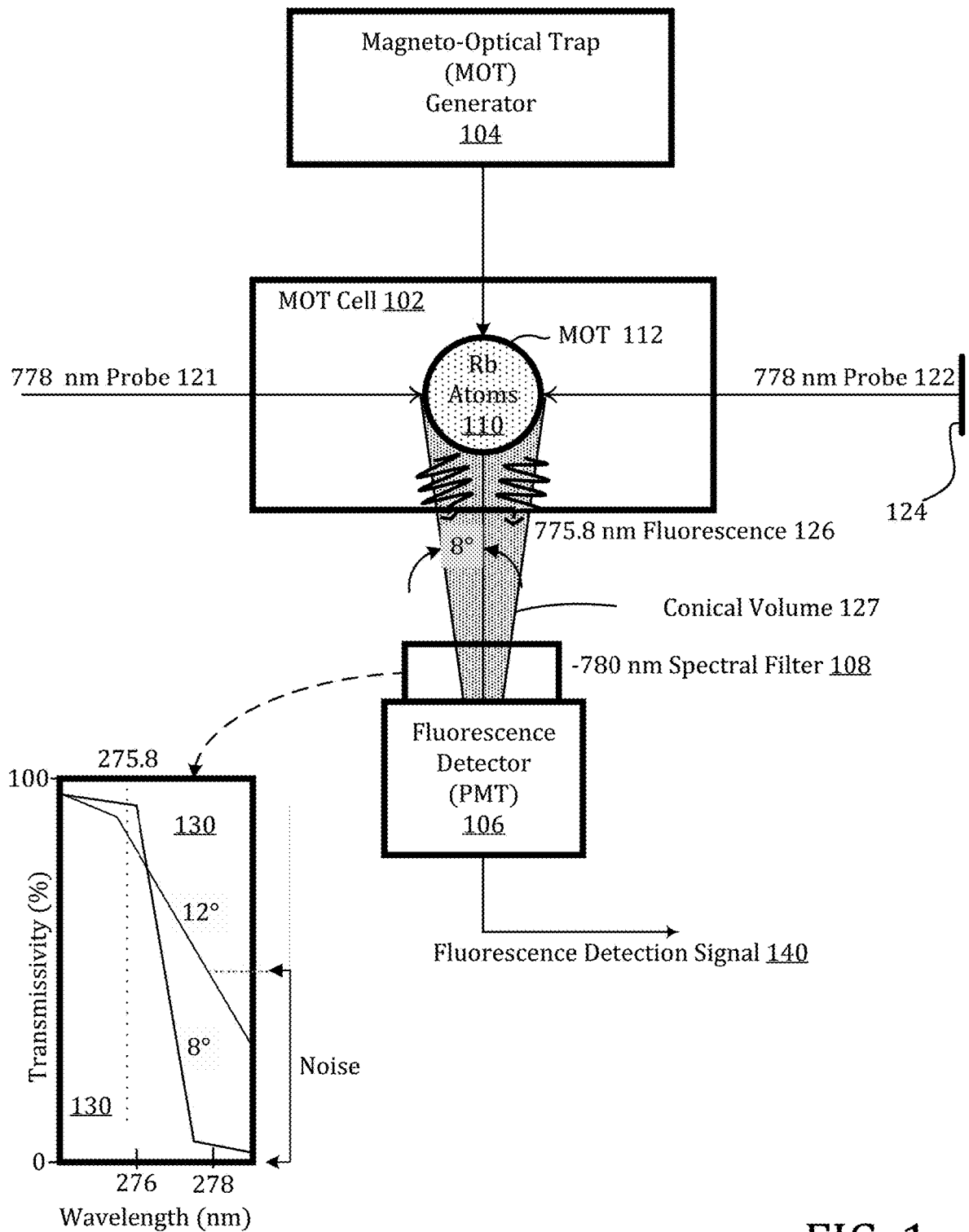
FIG. 1 is a schematic illustration of a fluorescence detection system.

For example, a fluorescence detection system 100, shown in FIG. 1, includes a magneto-optical trap (MOT) cell 102, a MOT generator 104, a fluorescence detector 106, and a spectral filter 108. Hermetically sealed MOT cell 102 is initially filled with rubidium 87 ($^{87}$Rb) atoms 110. MOT generator 104 cools and traps atoms 110 in a MOT 112 so as to localize them within cell 102. In alternative embodiments, other traps, e.g., all-optical traps, are used to localize $^{87}$Rb atoms, other atoms, or other molecular entities (e.g., polyatomic molecules) to such a subregion of a cell. Herein, an "optical trap" is any trap that uses optical beams to confine molecular entities; all-optical traps and magneto-optical traps are examples of optical traps.

Once localized by trap 112, atoms 110 are excited from a ground state to an excited state using a set of one or more probe beams. In the illustrated case, two counter-propagating probe beams 121 and 122 with wavelengths of about 778 nm are used for Doppler-free excitation of the atoms. Probe beam 122 results from a reflection of probe beam 121 off of a cats-eye retro-reflector 124 of fluorescence detection system 100. The percentage of atoms 110 that are excited is highest when the probe beam wavelength is 778.1 nm and is lower to the extent that the probe wavelength deviates from 778.1. In alternative embodiments, a second probe beam is nota reflection of a first probe beam, only a single probe beam is used, or three or more probe beams are used. In the illustrated embodiment, the probe beams have the same wavelength; other embodiments use plural probe beams of different wavelengths.

Once excited, atoms 110 spontaneously decay to their original ground state, emitting fluorescence in the process. Most of the decaying atoms emit fluorescence 126 consisting of photons with wavelengths of 775.8 nm. Fluorescence detector 106 is configured to detect incident 775.8 nm photons. Fluorescence is omnidirectional, so not all emitted photons with wavelength 775.8 nm reach fluorescence detector 106; for this reason, S/N is a concern, especially considering the presence of spectrally near 778 nm background noise resulting from scattering of the probe wavelengths.

Spectral filter 108 is used to reject 778 nm scatter (from the probe beams) while transmitting 775.8 nm fluorescence. A graph 130 of transmissivity vs. wavelength is plotted for angles of incidence of 8° and 12°. These plots show effective rejection of the 778 nm wavelength incident within 8° of perpendicular to spectral filter 108, but significantly less effective rejection near 12°, so that the resulting detection signal can have a substantial noise component due to detection of scatter from probe beams 121 and 122. By using an atom trap to localize fluorescence sources to a small subregion within an 8° cone, the present invention increases the percentage of 775.8 nm fluorescence transmitted and the percentage of 778 nm scatter blocked by spectral filter 108.

The fluorescence transmitted by spectral filter 108 is collected by fluorescence detector 106. Fluorescence detector 106 is a photomultiplier tube (PMT) with a 5 nanoamp (nA) dark current. This PMT provides a fast temporal response and high electron-multiplying gain. A fluorescence detection signal 140 results from fluorescence photons incident fluorescence detector 106.

Figure 2:
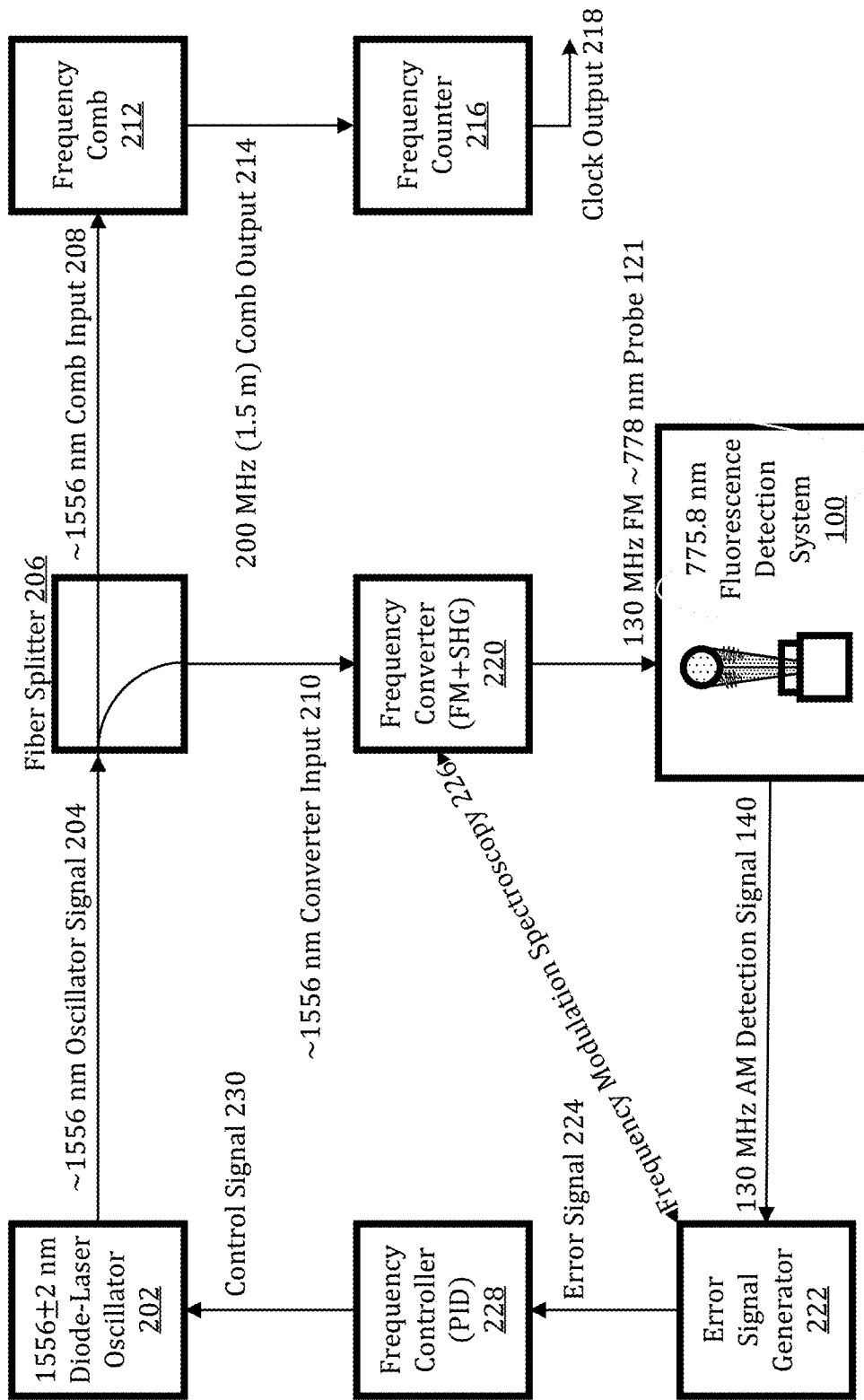
FIG. 2 is a schematic illustration of a rubidium optical atomic clock including the fluorescence detection system of FIG. 1.

A rubidium optical atomic clock 200, shown in FIG. 2, includes an oscillator 202, which is a diode laser that outputs an oscillator signal 204 with 20 millliwatts (mW) of light having wavelength 1556.2±2 nm. This diode laser has a fast linewidth that is significantly below the natural linewidth of the excited clock state ($\Delta v \approx 300$ kHz as observed at 778 nm), alleviating the requirement for laser pre-stabilization to a high finesse optical cavity. In FIG. 2, a tilda "~" is used for signals with frequencies and wavelengths that vary with the oscillator frequency.

A fiber splitter 206 splits oscillator signal 204 into a ~1556 nm comb input 208 and a ~1556 nm converter input 210. Comb input 208, which represents a small portion of oscillator signal 204, is input to an erbium fiber frequency comb 212 to form a beat note. Comb 212 serves to stabilize clock output 218 as long as the wavelength of oscillator signal 204 remains within a target range. Fully self-referenced frequency comb 212 divides the 385 THz comb input 208 to provide a comb output 214 of about 200 megahertz (corresponding to a radio frequency wavelength of 1.5 meters), which is the pulse repetition rate for frequency comb 212. After stabilization of the optical beat note and carrier envelope offset frequency, comb output 214 is photo-detected and input to a frequency counter 216, which can be a Microsemi 5125A, available from Mercury Systems, Inc. Phase noise is compared to a hydrogen maser reference. Frequency counter 216 provides the clock output 218. The following explains how oscillator 202 is regulated so that oscillator signal 204 remains within the target range for frequency comb 212.

~1556 nm converter input 210, which represents the larger portion of the output of fiber splitter 206, is input to frequency converter 220. Frequency converter 220 applies 130 kilohertz (kHz) sinusoidal signal to frequency modulate the ~1556 converter input 210 to prepare for frequency modulation spectroscopy (FMS). Frequency converter 210 then frequency doubles the modulated converter input using a second harmonic generator (SHG) to achieve a frequency modulated ~778.1 nm probe signal 121 which is effectively modulated at 260 kHz.

The resulting probe signal 121 is input to fluorescence detection system 100, which, as explained above with reference to FIG. 1, outputs fluorescence detection signal 140 in response. The 260 kHz frequency modulation of probe 121 results in a fluorescence detection signal with a 130 kHz amplitude modulation (AM) component. Error-signal generator 222 demodulates fluorescence detection signal 140 to obtain a laser detuning dependent error signal 224, completing the frequency modulation spectroscopy (FMS) 226 of atoms 110 (FIG. 1).

A frequency controller 228 generates a control signal 230 based on error signal 224. Control signal 230 is used to adjust the frequency of oscillator signal 204 to maintain it within the target range for frequency comb 212. Frequency controller 228 is a proportional integral differential (PID) controller that takes past, present and future into account when determining desired frequency corrections. The "present" is taken into account by the present value of the error signal. The "past" is taken into account by an integral over recent values of the error signal. The "future" is based on the present derivative of the error signal. The regulation cycle from oscillator 202 to fluorescence detection system 100 to frequency controller 228 is repeated frequently enough that the wavelength of oscillator signal 204 does not deviate outside the target range of wavelengths that frequency comb requires to maintain a stable clock output 208.

Further implementation details for atomic clock 200 can be gleaned from Kyle W. Martin et al. in "Compact Optical Atomic Clock Based on a Two-Photon Transition in Rubidium", arXiv:1903.11231v1 [physics.atom-ph] 27 Mar. 2019, which is incorporated in full herein by reference. Atomic clock 200 differs from the Martin atomic clock in several respects. While Martin detects 420 nm fluorescence and implicitly rejects 775.8 nm fluorescence, atomic clock 200 does the opposite: detecting 775.8 nm fluorescence and rejecting 420 nm fluorescence (although an alternative embodiment detects both wavelengths). Thus, while Martin need only distinguish between wavelengths that are more than 300 nm apart, atomic clock 200 must distinguish between wavelengths only 1 nm to 9 nm part, or, more specifically, about 2.2 nm apart. Thus, while Martin's $^{87}$Rb atoms are in the form of a hot vapor distributed through a vapor cell, the atoms of atomic clock 200 are cooled and then localized in a small volume with a cell to make the most of the narrow effective angle of incidence that characterize the spectral filter used to block 778 nm scatter from 775.8 nm fluorescence.

Figure 3:
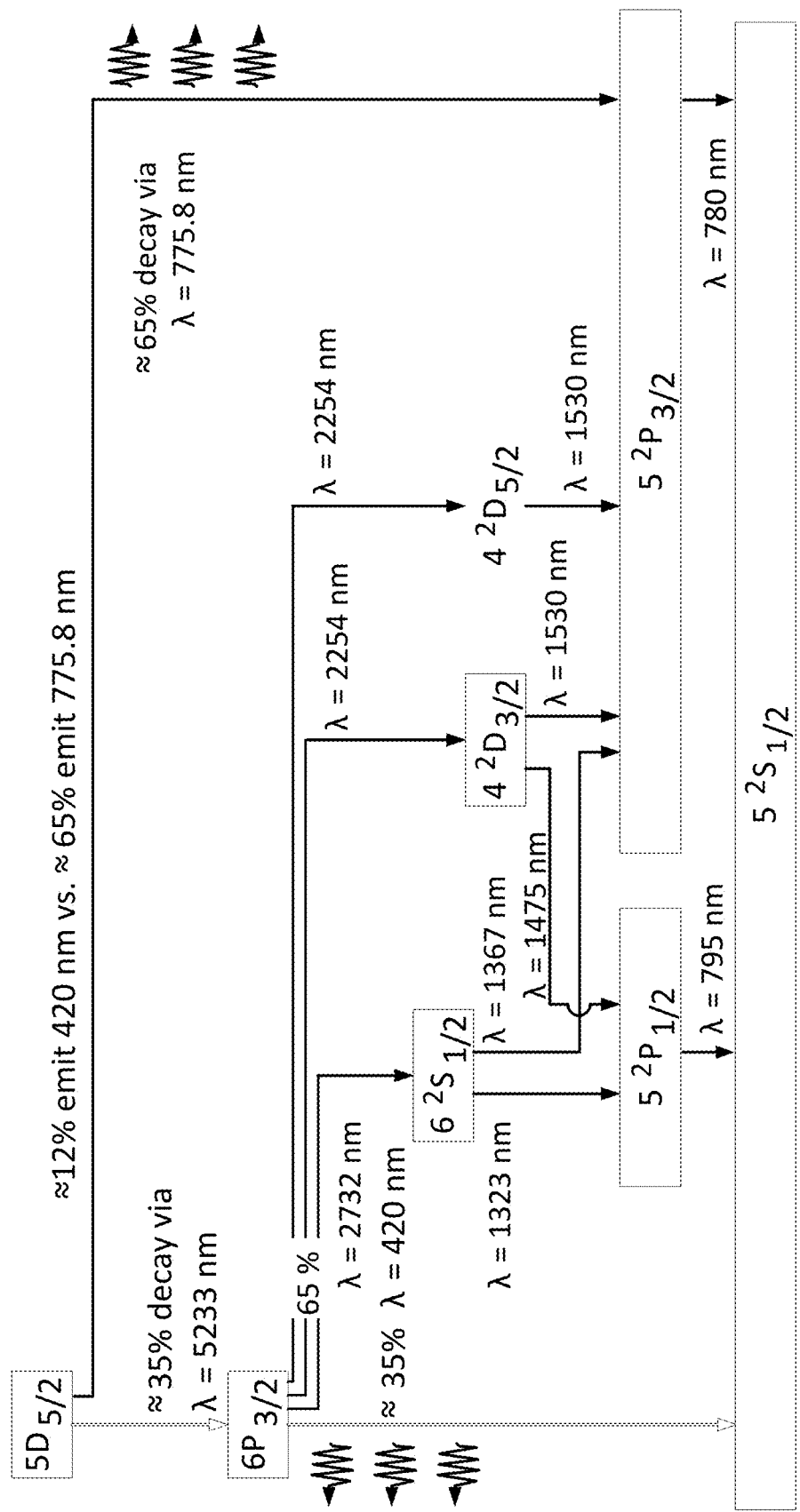
FIG. 3 is a directed graph of rubidium energy levels and transitions therebetween relevant to the fluorescence detection system of FIG. 1.

The advantage of using 775.8 nm fluorescence is apparent from rubidium 87 energy level diagram 300, FIG. 3. Atom clock 200 uses 778 nm light tuned to a monochromatic two-photon transition to excite $^{87}$Rb atoms from a $5^2D_{1/2}$ ground state to a $5D_{5/2}$ excited state. About 65% of the excited atoms decay to a $5_2P_{3/2}$ intermediate state, emitting 775.8 nm fluorescence in the process. This is the fluorescence detected by fluorescence detection system 100 and atomic clock 200. The remaining about 35% of excited atoms decay to an intermediate $6P_{3/2}$ energy level, and about 35% of these decay from the $6P_{3/2}$ intermediate energy level to the original $5^2D_{1/2}$ ground state, emitting 420 nm fluorescence in the process. Since 35%×35%=12.25%, only about 12% of the excited atoms provide this 420 nm fluorescence relied upon by Martin et al. The remaining about 65% of atoms at the intermediate $6P_{3/2}$ energy level decay to the $5^2D_{1/2}$ ground state through various other intermediate states. Thus, atomic clock 200 stabilizes its oscillator using detection of fluorescence that is five times stronger than the 420 nm fluorescence relied on by Martin et al.

Figure 4:
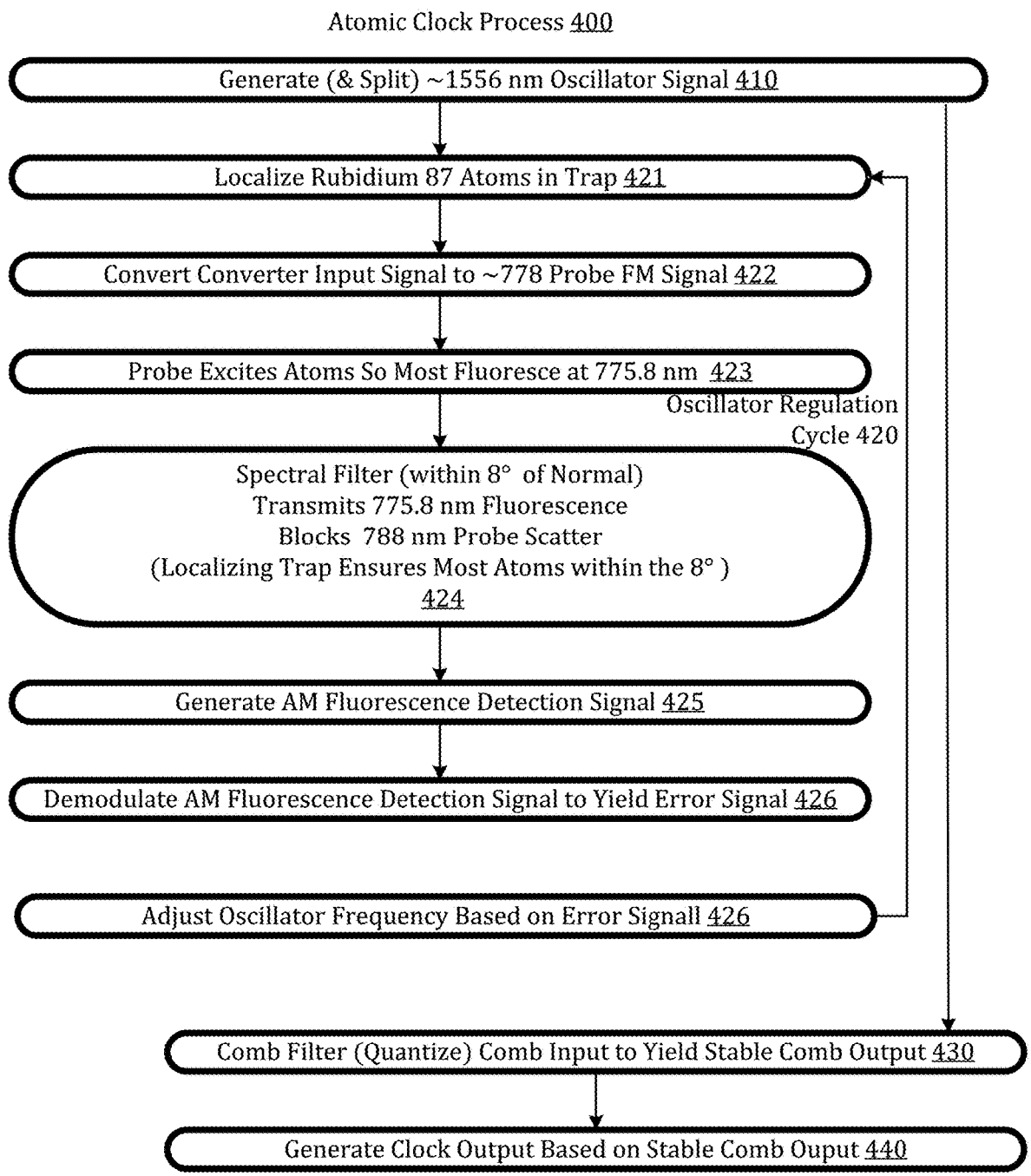
FIG. 4 is a flow chart of an atomic clock process implementable in the atomic clock of FIG. 2 and in other atomic clocks.

An atomic clock process 400, flow-charted at FIG. 4, is implemented by atomic clock 200 and other atomic clocks. At 410, a ~1556 nm signal is generated and split to yield a comb filter input and a frequency converter input. At 420, an oscillator regulation cycle is used to regulate the frequency of the oscillator signal so that the comb input remains within a target range required by a comb filter to provide a stable output. At 430, the comb filter provides a stable comb output signal. At 440, a stable clock output signal is generated based on the stable comb filter output.

Oscillator regulation cycle 42) includes, at 421, cooling and localizing $^{87}$Rb atoms in a trap occupying a volume that is a fraction (e.g., less than 1/10) of the size of a hermetically sealed cell containing the atoms. At 422, the converter input is frequency modulated using a 300 kHz sinusoidal signals and then frequency doubled to yield a ~778 nm FM probe signal. At 423, the probe and a retro-reflected copy of the probe excite the atoms such that most of the excited atoms fluoresce at 775.8 nm.

At 424, a spectral filter transmits 775.8 nm fluorescence while blocking ~788 nm scatter. Commercially available spectral filters can separate these wavelengths, which are only ~2.2 nm apart, provided the wavelength to be transmitted is perpendicular (i.e., "normal") to the filter or at least within an effective angle of incidence relative to the normal. In atomic clock 200, the effective angle for the wavelengths involved is 8°. Accordingly, the localization of atoms at 422 is such that most of the atoms are within a conical volume 127 defined by the 8° effective angle of incidence to ensure effective separation of the 775.8 nm fluorescence from the ~778 nm probe scatter.

The transmitted 775.8 nm fluorescence is collected by a fluorescence detector, which outputs a fluorescence detection signal, at 425. Due to the 260 kHz frequency modulation (FM) of the probe signal, the fluorescence detection signal is characterized by a 130 kHz amplitude modulation (AM). At 426 an error-signal generator demodulates the fluorescence detection signal to yield an error signal that indicates deviations in the oscillator signal from its expected frequency. At 427, a frequency controller adjusts as necessary the frequency of the oscillator signal based on the error signal to maintain the oscillator signal well within the target frequency range of the frequency comb. Oscillator regulation cycle 420 is repeated as often or more often than necessary to ensure a stable comb output and thus a stable atomic clock output at 440. Note that actions 421, 423, 424, and 425 constitute a fluorescence detection process with or without the frequency modulation and demodulation.

Fluorescence detection system 100 excites rubidium 87 atoms as sources of fluorescence. Other embodiments use other isotopes of rubidium, other alkali atoms, alkaline metal earth atoms, other atoms, and other molecular entities, e.g., fluorescent molecules. Herein, a "molecular entity" is "any constitutionally or isotopically distinct atom, molecule, ion, ion pair, radical, radical ion, complex, conformer, etc., identifiable as a separately distinguishable entity". The molecular entities of interest herein are those that can assume superpositions of energy levels in response to probe beams and from which they can decay so as to release fluorescence.

Some embodiments use two or more fluorescent species. Fluorescence detection system 100 uses a magneto-optical trap to localize atoms within a cell. Alternative embodiments use optical lattices, other all-optical traps, and other traps to localize the molecular entities. Fluorescence detection system 100 uses a monochromatic 2-photon excitation in which two steps of the transition are interrogated by respective probe photons of the same wavelength. Other embodiments use n-photon transitions, where n is a positive integer such as 1, 2 3, 4, 5 etc. In some embodiments, all probe wavelengths used are the same, while other embodiments employ probes of different wavelengths.

In various embodiments, frequency modulation spectroscopy can be implemented by frequency modulating a converter input with a sub-1 megahertz (MHz) in the process of producing a probe signal and demodulating a resulting fluorescence detection signal by a like frequency. In various embodiments, the probe wavelength can match the oscillator wavelength or can be derived from the oscillator wavelength in various ways. Depending on the embodiment, the spectral filter can be a low frequency pass filter (as used by Martin et al.), a high-frequency pass filter, a notch filter, a bandpass filter, or a combination of these filter types.

Herein, all art labeled "prior art', if any, is admitted prior art; art not labeled "prior art" is not admitted prior art. The illustrated embodiments, variations thereupon, and modifications thereto are provided for by the present invention, the scope of which is defined by the accompanying claims.

What is claimed is:

1. A fluorescence detection process comprising:
   forming an optical trap to localize molecular entities in a subregion of a cell, the subregion having a volume that is less than 1/10 of the internal volume of the cell;
   probing the trapped molecular entities using at least a first probe beam having a first probe wavelength so that the molecular entities emit fluorescence having a first fluorescence wavelength different from the first probe wavelength;
   spectrally filtering the fluorescence using a spectral filter, the spectral filter being characterized by an effective angle of incidence on the spectral filter within which the filter can effectively block the first probe wavelength and transmit the first fluorescence wavelength, the filter being less effective at blocking the first probe wavelength or transmitting the first fluorescence wavelength at angles larger than the effective angle of incidence, at least half of the trapped molecular entities that emit fluorescence being within a conical volume defined by the effective angle of incidence; and
   detecting spectrally filtered fluorescence transmitted by the spectral filter.

2. The fluorescence detection process of claim 1 wherein, in the absence of the optical trap, the molecular entities would be distributed throughout the cell so that fewer than half of the molecular entities would be within the conical volume defined by the effective angle of incidence.

3. The fluorescence detection process of claim 1 wherein the detecting results in a detection signal corresponding to a magnitude of the fluorescence detected.

4. The fluorescence detection process of claim 1 wherein an absolute value of a difference between the first probe wavelength and the first fluorescence wavelength is between one and nine nanometers.

5. The fluorescence detection process of claim 1 wherein a first percentage of the molecular entities emits fluorescence of the first fluorescence wavelength and a second percentage of the molecular entities emits fluorescence of a second fluorescence wavelength, the second percentage being less than half the first percentage, a first absolute value of a first difference between the second fluorescence wavelength and the first probe wavelength being more than twice a second absolute value of a second difference between the first fluorescence wavelength and the first probe wavelength.

6. The fluorescence detection process of claim 5 wherein the detecting includes detecting the fluorescence of the first and second fluorescence wavelengths, the fluorescence with the second fluorescence wavelength being transmitted by the spectral filter.

7. The fluorescence detection process of claim 5 wherein the detecting includes detecting the fluorescence of the first fluorescence wavelength but not of the second fluorescence wavelength, the fluorescence of the second fluorescence wavelength being blocked by the spectral filter.

8. The fluorescence detection process of claim 1 further comprising, prior to the probing, converting a source signal by frequency modulating a converter input signal with a sinusoidal signal having a frequency below 1 megahertz (MHz) and demodulating a resulting fluorescence detection signal to indicate deviations from a desired frequency for the source signal.

9. The fluorescence detection process of claim 1 wherein the molecular entities are rubidium 87 atoms, the first probe wavelength is 778±.5 nanometers and the first fluorescence wavelength is 775.8±.5 nanometers.

10. A fluorescence detection system comprising:

an hermetically sealed cell containing molecular entities;

a trap generator for generating an optical trap to confine the molecular entities to a subregion of the hermetically sealed cell;

a probe source for generating a probe beam causing the molecular entities to transition to a first excited state from which at least some of the molecular entities can emit fluorescence as they spontaneously return to a ground state, the probe beam having a first probe wavelength, the fluorescence including photons of a first fluorescence wavelength;

a spectral filter for spectrally filtering the fluorescence, the spectral filter being characterized by an effective angle of incidence on the spectral filter within which the spectral filter can effectively block the first probe wavelength and transmit the first fluorescence wavelength, the spectral filter being less effective at blocking the first probe wavelength or transmitting the first fluorescence wavelength at larger angles of incidence, at least half of trapped molecular entities being within a conical volume defined by the effective angle of incidence; and a fluorescence detector for detecting spectrally filtered fluorescence transmitted by the spectral filter.

11. The fluorescence detection system of claim 10 wherein, in the absence of the optical trap, the molecular entities would be distributed throughout the hermetically sealed cell so that fewer than half of the molecular entities would be within the angle of incidence.

12. The fluorescence detection system of claim 10 wherein the fluorescence detector outputs a detection signal corresponding to a magnitude of the detected fluorescence.

13. The fluorescence detection system of claim 10 wherein an absolute value of a difference between the first probe wavelength and the first fluorescence wavelength is between one and nine nanometers.

14. The fluorescence detection system of claim 10 wherein a first percentage of the molecular entities emit the fluorescence of the first fluorescence wavelength and a second percentage of the molecular entities emit the fluorescence of a second fluorescence wavelength, the second percentage being less than half the first percentage, a first absolute value of a first difference between the second fluorescence wavelength and the first probe wavelength being more than twice a second absolute value of a second difference between the first fluorescence wavelength and the first probe wavelength.

15. The fluorescence detection system of claim 14 wherein the detecting includes detecting the fluorescence of the first and second fluorescence wavelengths, the second fluorescence wavelength being transmitted by the spectral filter.

16. The fluorescence detection system of claim 14 wherein the detecting includes detecting the fluorescence of the first fluorescence wavelength but not the second fluorescence wavelength, the second fluorescence wavelength being blocked by the spectral filter.

17. The fluorescence detection process of claim 10 wherein the probe source, converting a source signal by frequency modulating a converter input signal with a sinusoidal signal having a frequency below 1 megahertz (MHz) and demodulating a resulting fluorescence detection signal to indicate deviations from a desired frequency for the source signal.

18. The fluorescence detection system of claim 10 wherein the molecular entities are rubidium 87 atoms, the first probe wavelength is 778±.5 nanometers and the first fluorescence wavelength is 775.8±.5 nanometers.

* * * * *